(12) United States Patent  (10) Patent No.: US 7,723,830 B2
Hauenstein  (45) Date of Patent: May 25, 2010

(54) SUBSTRATE AND METHOD FOR MOUNTING SILICON DEVICE

(75) Inventor: Henning Hauenstein, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 219 days.

(21) Appl. No.: 11/619,742

(22) Filed: Jan. 4, 2007

(65) Prior Publication Data

US 2007/0182008 A1  Aug. 9, 2007

Related U.S. Application Data

(60) Provisional application No. 60/756,738, filed on Jan. 6, 2006.

(51) Int. Cl.
*H01L 23/02* (2006.01)
(52) U.S. Cl. .................. 257/678; 257/684; 257/686
(58) Field of Classification Search .......... 257/678, 257/684, 686, 697, 723, E23.001, E23.194
See application file for complete search history.

(56) References Cited

U.S. PATENT DOCUMENTS

| | | | |
|---|---|---|---|
| 4,819,857 A * | 4/1989 | Mizuishi et al. ............. 228/121 |
| 5,844,304 A | 12/1998 | Kata et al. |
| 6,294,409 B1 | 9/2001 | Hou |
| 6,538,335 B2 | 3/2003 | Shimada et al. |
| 6,538,898 B1 * | 3/2003 | Prindivill et al. ............ 361/760 |
| 6,635,963 B2 * | 10/2003 | Egawa et al. ................ 257/737 |
| 7,224,071 B2 * | 5/2007 | Odegard .................... 257/778 |

(Continued)

FOREIGN PATENT DOCUMENTS

DE  2814642  10/1979

(Continued)

OTHER PUBLICATIONS

International Search Report issued Mar. 31, 2008 in corresponding PCT Application Serial No. PCT/US07/00273.

(Continued)

*Primary Examiner*—Phuc T Dang
(74) *Attorney, Agent, or Firm*—Farjami & Farjami LLP

(57) ABSTRACT

A substrate on which a silicon device is mounted in accordance with an embodiment of the present invention includes a plurality of protrusions extending upward from a top surface of the substrate and a solder layer formed on the top of the substrate such that the plurality of protrusions extends through the solder layer and a top portion of each protrusion of the plurality of protrusions is stamped down to be level with a top surface of the solder layer such that the silicon device is supported on the plurality of protrusions when placed on the substrate. The protrusions are preferably gouged up from the surface of the substrate with a needle like tool. A stamper tool is used to stamp the protrusions down to their desired height such that they are properly positioned to support the silicon device. The solder layer may be a solder pre-form or may be a layer of solder paste. The solder layer is heated to form liquid solder to bond the substrate and the silicon device, however, the protrusions support the silicon device to prevent movement thereof when the solder is in liquid form.

20 Claims, 4 Drawing Sheets

U.S. PATENT DOCUMENTS

| | | |
|---|---|---|
| 7,301,234 B2 * | 11/2007 | Lee .......................... 257/723 |
| 2001/0045668 A1 * | 11/2001 | Liou et al. ................ 257/778 |
| 2005/0093131 A1 | 5/2005 | Nakase |
| 2005/0224960 A1 | 10/2005 | Standing |

FOREIGN PATENT DOCUMENTS

| | | |
|---|---|---|
| EP | 0593986 | 4/1994 |
| FR | 2379165 | 8/1978 |
| GB | 2222727 | 3/1990 |
| JP | 57091528 | 6/1982 |
| WO | WO 02/14008 | 2/2002 |

OTHER PUBLICATIONS

US 5,905,304, 05/1999, Ewer et al. (withdrawn)

* cited by examiner

SUBSTRATE AND METHOD FOR MOUNTING SILICON DEVICE

CROSS REFERENCE TO RELATED APPLICATIONS

The present application claims the benefit of and priority to U.S. Provisional Patent Application Ser. No. 60/756,738 entitled SOLDER THICKNESS CONTROL FOR BOND WIRELESS DISCRETE Si PACKAGE, filed Jan. 6, 2005, the entire contents of which are hereby incorporated by reference herein.

BACKGROUND OF THE INVENTION

Advances in semiconductor technology have driven the performance limits of silicon beyond the capabilities of present packages. In particular, the power and current carrying capability of MOSFETS and IGBT's are often limited by insufficient package performance. The thermal and electrical resistance of the package results in power losses and corresponding heating of silicon beyond the limits thereof. In addition, the inductance of the package also results in certain limits for use with high switching currents. In particular, parasitic package inductance may result in inductive overvoltage that can destroy the silicon device (Si-device). This is a particular problem in conventional packaging that utilizes bond wires for the electrical connection of the top metal of the Si-device to a lead frame or other external metal terminals.

Newer packaging technologies attempt to minimize inductance and provide improved thermal connectivity to a heatsink by bond wireless connection techniques. One example of such packaging is provided in assignee International Rectifier Corporation's Direct DirectFET® line of products which are further described in U.S. Pat. No. 6,624,522, the entire contents of which are hereby incorporated by reference herein. Another example of such alternative packaging technology utilizing a horseshoe-shaped direct bonded copper substrate (DBC) can is provided in assignee's Provisional Patent Application Ser. No. 60/761,722, filed Jan. 24, 2006, entitled STRESS-REDUCED BOND-WIRELESS PACKAGE FOR HIGH POWER DENSITY DEVICES (IR-3177 Prov) from which Assignee's presently co-pending application Ser. No. 11,641,270 entitled PACKAGE FOR HIGH POWER DENSITY DEVICES filed Dec. 18, 2006 claims priority. The entire contents of each of these applications is hereby incorporated herein by reference. In these references, a Si-device, or die, is mounted in a can-shaped housing and the top side of the power device (source/emitter and gate contact) is soldered to a metal pad in order to gain higher current carrying ability, reduced inductance and better thermal performance. In particular, for power switches, providing a large metal contact on both sides of the Si-die is beneficial to optimize electric and thermal performance.

The introduction of such bond wireless die attachment designs, however, makes the solder joint more important. In particular, the solder joint and the potential failure mechanism of this contact layer has a major influence on the quality and reliability of products in which it is used. The solder joint becomes particularly important when the solder joint forms both the electrical and mechanical contact layer on the top and bottom of the Si-device.

Typically, the top side of the die is contacted by wire bonds to a substrate or leadframe. In the case of bond wireless technology, solder bumps are provided on the die on a wafer level. The bumps are relatively small for the gate pad of a power switch or for IC contact pads (e.g. ball grid arrays) and are relatively large when used to establish high current connections for source pads of MOSFETS or IGBTs, for example.

Further, generally, the back side of the Si-device is usually soldered to a substrate such as a metal leadframe, DBC, printed circuit board (PCB) etc. This solder area is relatively large and typically corresponds to die size. For this back side attachment, it is common to use a solder paste which is a mixture of a solder alloy (such as PbSn or lead free SnAgCu) and a flux. The flux is used to clean the contact surfaces and optimize the wetting of the solder, especially on oxidized surfaces such as copper. Typically, the solder paste is dispensed or stencil printed on the substrate (leadframe, DBC, PCB, etc) and then the die is placed in the solder paste nest. The solder paste is then melted in a solder oven (or reflow oven) to form the intermetallic contact between the Si-metallization and the substrate metal.

Using this technology, it is common to adjust the solder thickness oven profile (temperature and time). However, this approach does not provide for very close control of solder thickness. For example, die movement during the liquid phase of the solder paste often results due to creeping or flow of the liquid solder. Such creep and/or flow cannot be well predicted. Further, different wetting of the solder paste to the substrate or leadframe may result in a thinner or thicker distribution of solder, and thus, variations in the thickness of the final solder layer.

One means for addressing these problems is the use of a pattern of solder-stop lacquer on the substrate or leadframe to prevent the solder from spreading too far or by otherwise limiting the metal pad area. However, such techniques are generally expensive and don't completely prevent die movement. For example, such techniques do not address problems that can arise when the die is tilted. Further, when such techniques are used, it is difficult to change the die, solder pattern or solder thickness without changing the tooling and other equipment used, which can be expensive and time consuming.

Shifts in the position of the die result in the die not being properly postioned relative to the circuit pattern and/or may result in the die being tilted in one direction or the other. Further, chemical reactions between the flux and the contact surfaces can result in bubbling of the solder when in the liquid phase. This is another source of unwanted movement of the die.

These problems may not reduce yield in certain applications. That is, the movement of the die may not be a problem in certain applications, however, precise positioning of the die may be critical in other applications. Even small movements of the die can be a problem for wire bond processes to fine-structure pads or when the Si-device is to be flip-chip soldered with narrow tolerances in bump position (height and location). It is particularly important that the die be level and well positioned after mounting in the metallic can used in the DirectFET® line of products.

One other problem with present solder paste technology is the residue of the flux that is typically stuck to the die or substrate after the solder process. This residue may be hard to remove, and if not removed, may cause problems with wire bonding or other electrical contact techniques. Also, any subsequent mold processing would require that the flux be removed. Thus, the removal of the flux is often necessary, and thus represents additional expense.

An alternative technique is the use of so-called solder pre-form in place of the solder paste. The solder pre-forms are typically pre-formed sections of solder foil with a defined thickness (typically 10 µm to over 100 µm) and dimensions that roughly correspond to the desired solder pad size. These pre-forms are typically used without flux. They are typically soldered via a formic gas vacuum soldering process in which formic gas (e.g. formic acid in gas phase) performs the role of the flux to clean the surfaces without leaving a residue. However, this technique still makes it difficult to control the thickness of the solder layer. While the thickness of the solder layer is set by the thickness of the solder pre-form, when the solder melts, this thickness changes. Further, the die also moves when the solder melts, which also results in variation of the solder thickness as noted above.

FIG. 1 is an illustration of an Si-device, of die, 100 that is mounted on a substrate, or leadframe, 102 via a solder layer 104 with varying thickness 104a, 104b. As illustrated, the conventional techniques result in variations in the position of the die 100 on the substrate 102 and the additional problems of the flux residue 106 noted above. For example, in FIG. 1, better wetting of the substrate 102 on one side of the die 100 has resulted in the solder spreading further in that direction. Thus, the thickness of the solder layer 104 on that side is smaller than that on the other side and the die 100 is tilted.

The problems described above and illustrated in FIG. 1 are common in all conventional Si-die attachment techniques. In some applications, these variations are not a particular problem. However, in applications where a single device needs to be soldered precisely in a metal housing, like a MOSFET in the DirectFET® line of products noted above or in the horseshoe-shaped can mentioned in the co-pending application entitled PACKAGE FOR HIGH POWER DENSITY DEVICES mentioned above, these variations are unacceptable.

In order to avoid some of these problems, an adhesive may be used to attach the Si-die, or device, to the metallic can. For example, adhesives may be used to attach the Si-device in the DirectFET® line of products since the adhesive glue can be better controlled. However, a solder connection would provide superior electrical and thermal characteristics and would provide for an increase in the current carrying ability. However, as described above, conventional solder bonding does not provide for precise enough control to allow for its use in the DirectFET® line of products. In particular, the DirectFET® line of products require that the gate bumps and source bumps be in a precise position and perfectly level with respect to the metallic can, which are problems with the soldering techniques described above.

One alternative means for mounting one device on another is proposed in U.S. Pat. No. 4,934,679 to Kaiser. In Kaiser, a positional fixation element, or elements, are provided on a first structural component to fix the position of a second structural component that is mounted on the first structural component. A mandrel-like tool is used to form the positional fixation elements(s). Specifically, the tool is pressed into the first component on an incline relative to a reference plane of the first element. In the process, material is displaced to form a groove and an accumulation of material with a shape corresponding to that of the position fixation element. The position fixation element(s) are suitable for positioning electrical circuits, for example, when glued or soldered onto a first component. While the positional fixation elements of Kaiser may be useful to position the second component, the mandrel tool used to make them may not always provide an equal accumulation of material, and thus, the positional fixation elements may not provide a stable support for the second component.

Thus, it would be beneficial to provide a substrate and method that allows for mounting a Si-device thereon using solder that avoids the problems described above.

SUMMARY OF THE INVENTION

It is an object of the present invention to provide a bond wireless package with a structure that enables a well controlled solder thickness and a flat die attachment which prevents the Si-die from tilting and stabilizes the positioning of the Si-die during the liquid phase of the solder at a low cost.

It is another object of the present invention to provide an innovative and low cost structure for a metal can, or substrate, that allows a precise control of the solder thickness and prevents tilting of the die.

A substrate on which a silicon device is mounted in accordance with an embodiment of the present application includes a plurality of protrusions extending upward from a top surface of the substrate and a solder layer formed on the top of the substrate such that the plurality of protrusions extends through the solder layer and a top portion of each protrusion of the plurality of protrusions is level with a top surface of the solder layer such that the silicon device is supported on the plurality of protrusions when placed on the substrate.

A method of mounting a silicon device on a substrate in accordance with an embodiment of the present invention includes providing a substrate, forming a plurality of protrusions extending upward from a top surface of the substrate, placing a solder layer on the top surface of the substrate such that the plurality of protrusions passes through the solder layer, stamping the solder layer and the protrusions down such that a top portion of each protrusion of the plurality of protrusions is stamped down to a level of a top surface of the solder layer, placing the silicon device on top of the solder layer such that the silicon device is substantially supported by the plurality of protrusions and heating the solder layer such that liquid solder is formed to bond the silicon device to the substrate, wherein the silicon device remains in place on the protrusions during the heating.

Other features and advantages of the present invention will become apparent from the following description of the invention which refers to the accompanying drawings.

BRIEF DESCRIPTION OF THE DRAWING(S)

DETAILED DESCRIPTION OF PREFERRED EMBODIMENTS OF THE INVENTION

Figure 1:
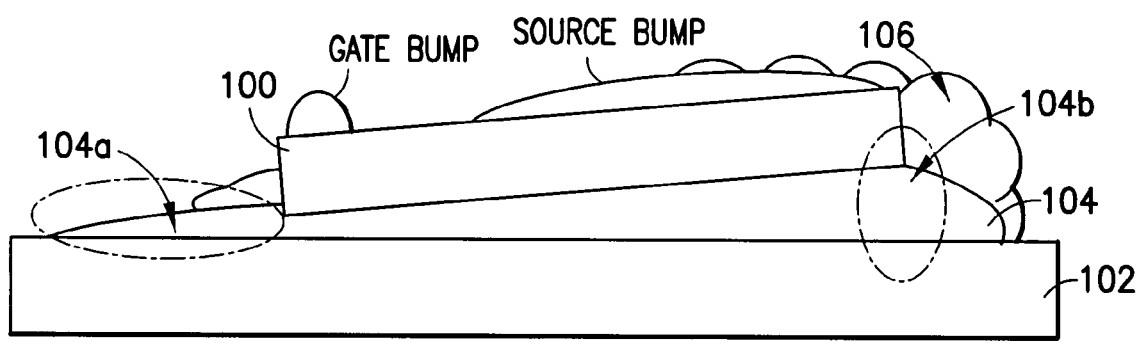
FIG. 1 is an illustration of a conventional Si-device mounted on a substrate utilizing solder paste.
Figure 2:
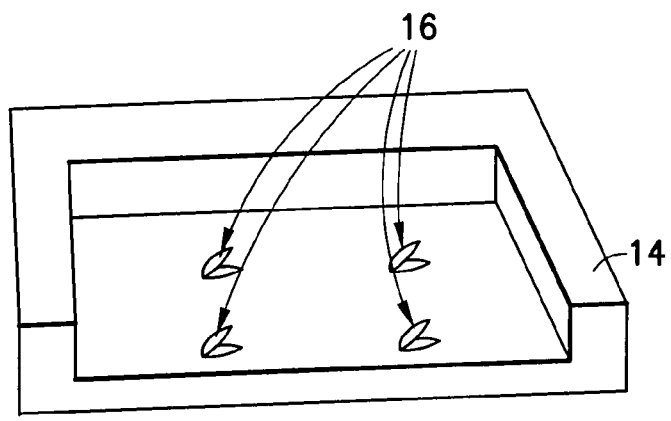
FIG. 2 is an illustration of a substrate for mounting of a silicon device in accordance with an embodiment of the present invention.
Figure 3:
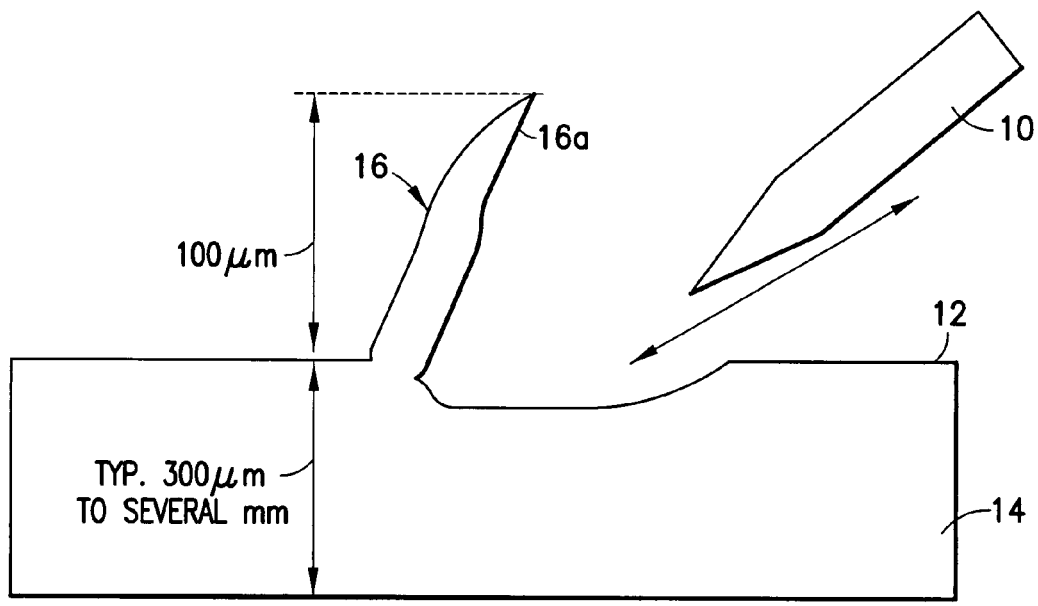
FIG. 3 is an illustration of a needle tool forming a protrusion on the substrate of FIG. 2 in accordance with an embodiment of the present invention.

A substrate on which a Si-device, or die is mounted in accordance with an embodiment of the present invention is illustrated, for example, in FIGS. 2-6 of the present application. In a preferred embodiment, as illustrated in FIG. 3, a needle-like tool 10 is used to gouge the top metal surface 12 of the substrate 14 to produce a substantially vertical protrusion 16 (or swarf) extending upward from the surface 12 of the substrate 14. As illustrated, the protrusion 16 preferably has a height of approximately 100 µm. While this is a preferred height of the protrusion 16, the height of the protrusion may be modified as appropriate for the specific application.

In a preferred embodiment, the substrate 12 is a metallic can, for example the metal can utilized in the DirectFET® line of products or the Cu-layer of a horseshoe shaped DBC such as that described above in co-pending application entitled PACKAGE FOR HIGH POWER DENSITY DEVICES. However, the protrusions 16 may similarly be formed on any substrate, if desired. In a preferred embodiment, as illustrated in FIG. 2, for example, four protrusions 16 are gouged into the substrate 14 in a substantially rectangular pattern. Alternatively, three protrusions 16 may be gouged into the surface in a triangular pattern if desired. While particular examples are mentioned above, any number of protrusions 16 may be gouged into the substrate as desired provided that they will be able to support the Si-device that is placed on the substrate, as is described below.

Figure 4:
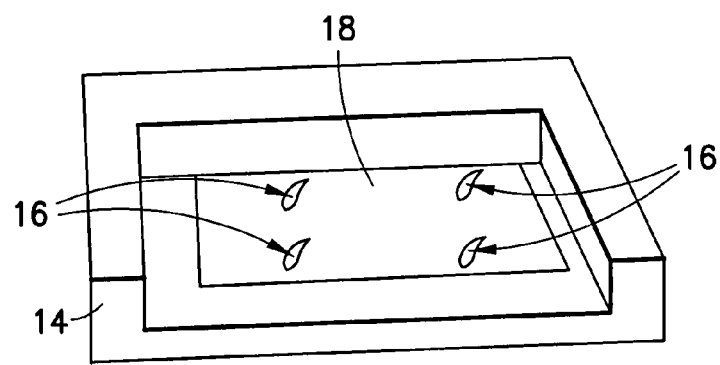
FIG. 4 illustrates a solder layer positioned on the substrate of FIG. 2.

Thereafter, as illustrated in FIG. 4, a solder pre-form 18 is positioned on the top surface 12 of the substrate 14. The solder pre-form 18 is preferably selected based on the desired thickness of the final solder layer of the final substrate-Si-device package. The pre-form 18 is pressed down such that the protrusions 16 extend through the pre-form 18. Preferably, the tops 16a of the protrusions 16 extend through a top surface 20 of the pre-form 18.

Figure 5:
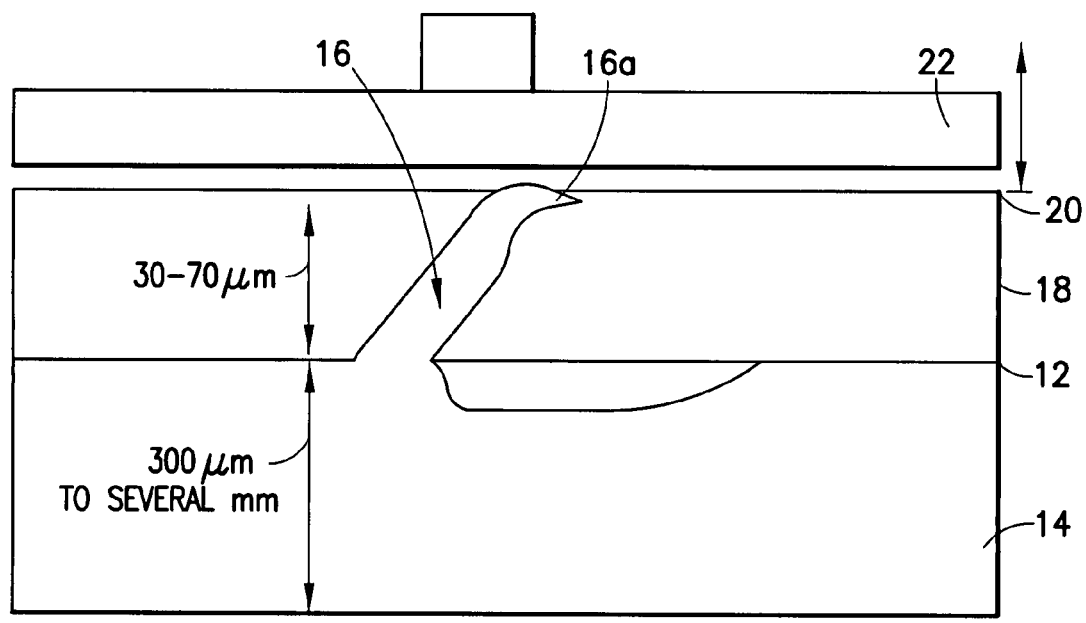
FIG. 5 illustrates a stamper tool used to stamp the protrusions and solder layer illustrated in FIG. 4.
Figure 6:
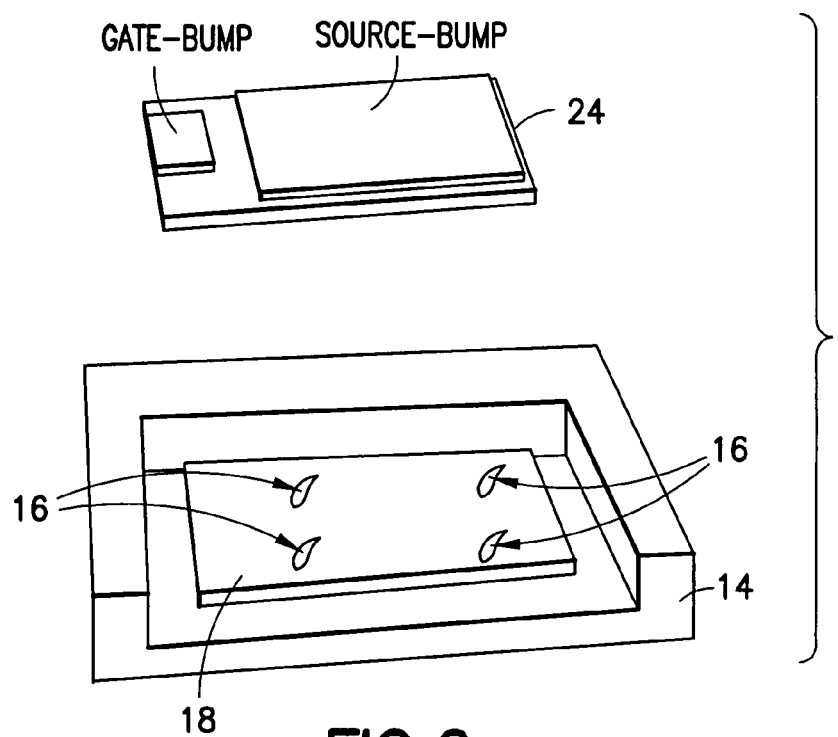
FIG. 6 illustrates a silicon device being placed on the substrate of FIGS. 2-4.

A stamper tool 22 is used to stamp down the top portion 16a of the protrusions 16 to contact the top surface 20 of the pre-form 18 as illustrated in FIG. 5, for example. The use of the stamper 22 ensures that the top portion 16a of all of the protrusions 16 is stamped down to the same level, thus providing a stable platform for the silicon device 24. Thus, the Si-device, or die, 24 is then preferable placed on top of the pre-form 18 as indicated in FIG. 6.

It is noted that the protrusions 16 can be formed and the pre-form added to the substrate 12 during manufacture of the can or substrate 12, for example, and the Si-device added later. In this manner, substrates suitable for mounting Si-devices in accordance with the present invention may be produced in quantity for various applications. The Si-device 24 may be a diode, MOSFET or IGBT, or the like for example. A gate bump and a source bump, may be provided as illustrated in FIG. 6.

Therafter, the solder of the pre-form 18 is melted, for example, in a solder oven, as mentioned above. The protrusions 16 however, remain in place and thus provide a stable platform on which the Si-device 24 rests. Thus, movement of the Si-device 24 while the solder is in liquid form is minimized. The protrusions 16 will keep the Si-device in the desired position while the adhesion of the melted solder to the back side of the metal of the Si-device, or die, 24 will tend to keep solder under the die and will help prevent spreading of the solder, thus maintaining a solder layer with a substantially common width. The weight of the die 24 will not force the solder outward as it does in the traditional soldering processes since the protrusions 16 support the die 24. Indeed, the capillary affect of the adhesion of the solder to the back side of the Si-device tends to keep the solder under the die. Thus, the thickness of the solder layer can be well controlled and maintained close to the area under the die.

Figure 7:
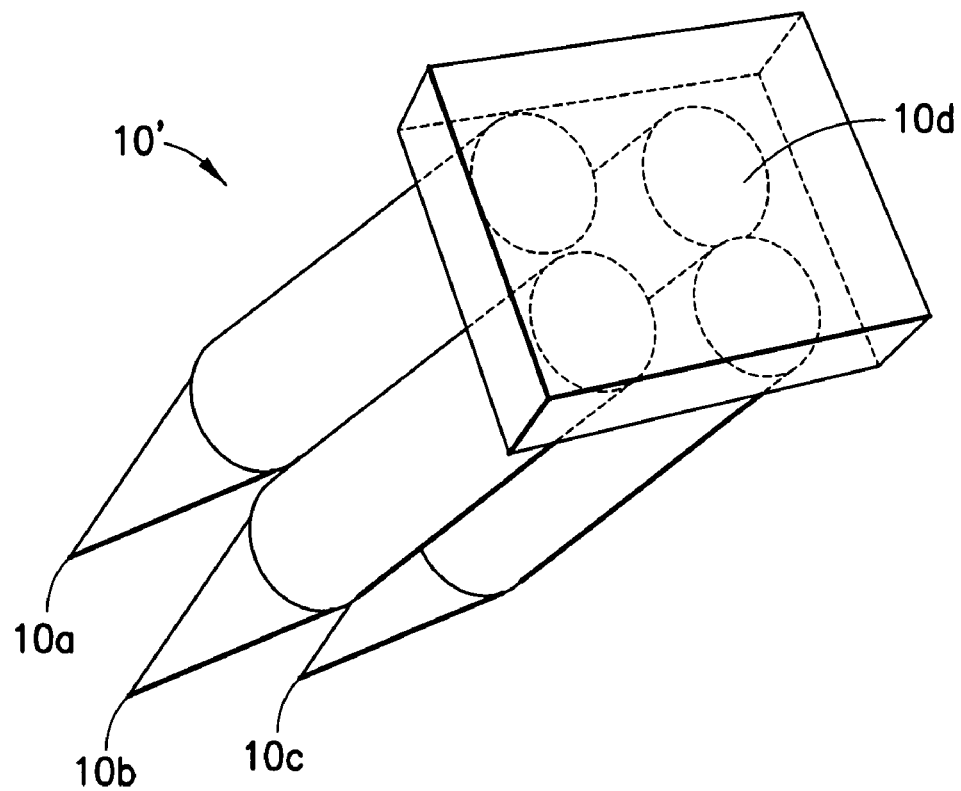
FIG. 7 is an illustration of a needle tool used to form the protrusions on the substrate of FIG. 2 in accordance with another embodiment of the present invention.
Figure 8:
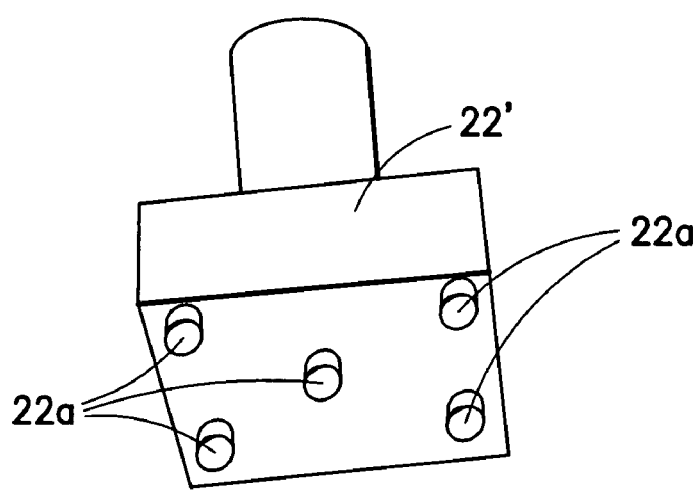
FIG. 8 is an illustration of a stamper tool used to stamp the solder layer and protrusions in accordance with another embodiment of the present invention.

In another embodiment, as illustrated in FIG. 7, a needle tool 10' used to form the protrusions 16 as described above may include multiple needle heads 10a, 10b . . . 10d which can be used to form multiple protrusions 16 on the substrate 12 at the same time. FIG. 7 illustrates 4 needles heads 10a, but the tool 10' may include more or less needle heads as desired.

In another embodiment, it may be useful to use solder paste instead of the sold pre-form 18. In this embodiment, the stamper tool 22 may include a plurlaity of bumps 22a extending from a bottom surface thereof These bumps 22a are used to establish the height of the protrusions 16 after being pressed down when the top surface 20 of the pre-from 18, for example, is not available. The bumps 22a are preferably positioned such that as the stamper head is lowered down into the solder layer (solder paste), the protrusions 16 are offset from the bumps. Thus, the swrafs 16 all remain at the same height and provide a level surface on which the die 24 is supported. It is noted however, that when solder paste is used, there should be an additional step to remove the flux residue from the die 24 and the substrate 12, as noted above. As noted above, flux residue removal is commonly required, and thus, any appropriate process for removing the flux residue may be used.

Thus, in accordance with the present invention a substrate 12 is provided that allows for the placement of a Si-device, or die, 24 thereon in a precise position with a flat orientation with a solder layer having a substantially constant and desired thickness. The use of a solder connection between the die 24 and the substrate 14 provides for good electrical and thermal characteristics and allows for relatively large current carrying capacity while the use of the protrusions 16 provides a stable base for the die 24 when the solder is in liquid form to limit movement of the die. As a result, the die 24 can be precisely positioned and leveled on the substrate 12. Thus, the substrate of the present invention is useful for the DirectFET® line of products or for use with the horseshoe shaped cans mentioned above. Naturally, the substrate and method described herein could be used in any application where precise placement of a die on the substrate is important.

The protrusions 16 may be made individually by a single needle like tool 10 or using a tool that include several needle heads 10' in the desired configuration. While the present specification discloses the use of three or four protrusions 16, any number of protrusion may be used.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A substrate on which a silicon device having contacts on opposing major surfaces is mounted comprises:

a plurality of protrusions extending upward from a top surface of the substrate; and a solder layer formed on the top of the substrate such that the plurality of protrusions extends through the solder layer and a top portion of each protrusion of the plurality of protrusions is stamped down to be level with a top surface of the solder layer such that the silicon device is supported on the plurality of protrusions when placed on the substrate;

whereby the contacts of the silicon device are electrically connectable to substantially coplanar external terminals without bondwires.

2. The substrate of claim 1, wherein each protrusion of the plurality of protrusions is formed by a needle tool operable to gouge the top surface of the substrate to raise the plurality of protrusions.

3. The substrate of claim 1 wherein the plurality of protrusions are formed by a needle tool including multiple needle heads operable to gouge the top surface of the substrate to raise every protrusion of the plurality of protrusions at one time.

4. The substrate of claim 1, wherein the plurality of protrusions are arranged in a predetermined pattern suitable for providing stable support for the silicon device.

5. The substrate of claim 1, wherein the solder layer is a solder pre-form having a desired thickness and wherein the top of each protrusion of the plurality of protrusions is stamped down by a stamper tool to be level with a top surface of the solder pre-form.

6. The substrate of claim 1, wherein the solder layer is a layer of solder paste having a desired thickness and the top of each protrusion of the plurality of protrusions is stamped down by a stamper tool to be level with a top surface of the layer of solder paste.

7. The substrate of claim 1, wherein the plurality of protrusions are arranged in a selected pattern such that the plurality of protrusions support the silicon die when it is mounted on the substrate.

8. The substrate of claim 1, wherein the substrate is a metallic can and the silicon device is a MOSFET.

9. The substrate of claim 1, wherein the substrate is a metallic can and the silicon device is a IGBT.

10. The substrate of claim 1, wherein the substrate is a metallic can and the silicon device is a diode.

11. A substrate on which a silicon device having contacts on opposing major surfaces is mounted comprises:
   a plurality of protrusions extending upward from a top surface of the substrate; and
   a solder layer formed on the top of the substrate such that the plurality of protrusions extends through the solder layer and a top portion of each protrusion of the plurality of protrusions is level with a top surface of the solder layer;
   whereby the plurality of protrusions prevents movement of the silicon device when the solder layer is heated to a liquid form to mount the silicon device on the substrate and to enable electrical connections of the contacts of the silicon device to substantially coplanar external terminals without bondwires.

12. The substrate of claim 11 wherein the plurality of protrusions are formed using a needle tool.

13. The substrate of claim 12, wherein the needle tool includes a plurality of needle heads in a predetermined configuration to form every protrusion of the plurality of protrusions at one time.

14. The substrate of claim 11, wherein the solder layer comprises a solder pro-form having a selected width.

15. The substrate of claim 14, wherein the plurality of protrusions is stamped down using a stamping tool with a substantially flat bottom surface to a desired level that is substantially even with a top surface of the solder pre-form.

16. The substrate of claim 11, wherein the solder layer comprises a layer of solder paste having a desired width.

17. The substrate of claim 16, wherein the plurality of protrusions is stamped down using a stamping tool having a plurality of bumps formed on a bottom surface thereof such that a height of the bumps indicates a level to which the top portion of each protrusion of the plurality of protrusions is stamped down to.

18. The substrate of claim 11, wherein the heating of the solder layer is performed in a solder oven for a predetermined time at a desired temperature.

19. The substrate of claim 11, wherein the substrate is a metallic can and the silicon device is a MOSFET.

20. The substrate of claim 11, wherein the substrate is a metallic can and the silicon device is an IGBT.

* * * * *

UNITED STATES PATENT AND TRADEMARK OFFICE
CERTIFICATE OF CORRECTION

| | | |
|---|---|---|
| PATENT NO. | : 7,723,830 B2 | Page 1 of 1 |
| APPLICATION NO. | : 11/619742 | |
| DATED | : May 25, 2010 | |
| INVENTOR(S) | : Hauenstein | |

It is certified that error appears in the above-identified patent and that said Letters Patent is hereby corrected as shown below:

In the claims, column 7, line 30, "a IGBT" should be changed to --an IGBT--.

In the claims, column 8, line 17, "pro-form" should be changed to --pre-form--.

In the claims, column 8, line 20, "fiat" should be changed to --flat--.

Signed and Sealed this
Twenty-second Day of November, 2011

David J. Kappos
*Director of the United States Patent and Trademark Office*